(12) United States Patent
Taft et al.

(10) Patent No.: US 11,177,251 B2
(45) Date of Patent: Nov. 16, 2021

(54) CIRCUIT OVERVOLTAGE PROTECTION

(71) Applicant: TEXAS INSTRUMENTS INCORPORATED, Dallas, TX (US)

(72) Inventors: Robert Callaghan Taft, Munich (DE); Tobias Hoehn, Munich (DE); Karim Thomas Taghizadeh Kaschani, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 39 days.

(21) Appl. No.: 16/780,933

(22) Filed: Feb. 4, 2020

(65) Prior Publication Data

US 2020/0176440 A1    Jun. 4, 2020

Related U.S. Application Data

(62) Division of application No. 15/825,813, filed on Nov. 29, 2017, now Pat. No. 10,593,661.

(60) Provisional application No. 62/466,876, filed on Mar. 3, 2017.

(51) Int. Cl.
*H01L 27/02* (2006.01)
*H01L 23/50* (2006.01)
*H02H 9/04* (2006.01)
*H01L 29/06* (2006.01)

(52) U.S. Cl.
CPC .......... *H01L 27/0255* (2013.01); *H01L 23/50* (2013.01); *H01L 27/0266* (2013.01); *H01L 29/0684* (2013.01); *H02H 9/046* (2013.01)

(58) Field of Classification Search
CPC .................................................. H01L 27/0255
See application file for complete search history.

(56) References Cited

U.S. PATENT DOCUMENTS

| 4,757,363 | A | 7/1988 | Bohm et al. | |
|---|---|---|---|---|
| 2012/0176708 | A1* | 7/2012 | Tsai | H01L 29/7391 361/56 |
| 2014/0268444 | A1* | 9/2014 | Bertin | H01L 27/0266 361/56 |
| 2014/0268446 | A1* | 9/2014 | Gudem | H02H 9/041 361/56 |
| 2014/0306750 | A1* | 10/2014 | Toyoda | H01L 23/5256 327/525 |
| 2014/0376135 | A1* | 12/2014 | Huo | H02H 9/046 361/56 |

(Continued)

*Primary Examiner* — Douglas M Menz
(74) *Attorney, Agent, or Firm* — John R. Pessetto; Charles A. Brill; Frank D. Cimino

(57) ABSTRACT

An electronic circuit includes an electronic device, an input/output terminal, and a protection device. The electronic device includes a signal terminal to receive an input signal. The input/output terminal is configured to receive the input signal from a source external to the electronic circuit. The protection device is coupled to the electronic device and to the input/output terminal. The protection device is configured to protect the electronic device from voltage of the input signal exceeding a threshold. The protection device includes a first semiconductor region, a first contact, and a second contact. The first contact connects the first semiconductor region to the input/output terminal. The second contact connects the first semiconductor region to the signal terminal of the electronic device.

7 Claims, 3 Drawing Sheets

(56) References Cited

U.S. PATENT DOCUMENTS

2015/0002965 A1* 1/2015 Hayashi .............. H01L 27/0266
361/56

* cited by examiner

CIRCUIT OVERVOLTAGE PROTECTION

RELATED APPLICATIONS

This divisional application claims priority to U.S. patent application Ser. No. 15/825,813, filed Nov. 29, 2017, which application claims the benefit of and priority to U.S. Provisional Application No. 62/466,876, filed Mar. 3, 2017, both of which are incorporated herein by reference in their entirety.

BACKGROUND

Integrated circuits (ICs) may be severely damaged by electrostatic discharge (ESD) phenomena. An IC may be exposed to ESD from many sources. A major source of ESD exposure to ICs is from the human body, and is known as the Human Body Model (HBM) ESD source. A charge of about 0.2 micro-coulombs can be induced on a human body having a capacitance of 100 pF, leading to electrostatic potentials of 2 kV or greater. Any contact by a charged human body with a grounded object, such as a terminal of an IC, can result in a discharge for about 100 nano-seconds with peak currents of several amperes to the IC.

A second ESD model is the charged device model (CDM). Unlike the HBM ESD source, the CDM ESD source includes situations where the IC itself becomes charged and discharges to ground when any of its pins makes contact to a grounded conductive object. Thus, a CDM discharge requires only one IC pin to be contacted, whereas a HBM discharge requires at least two IC pins to be contacted. CDM pulses also have very fast rise times compared to the HBM ESD source.

Because of high electrostatic voltages resulting in large ESD currents on the one hand and low breakdown voltages of IC components on the other hand, the problem of ESD with IC components can be severe. Therefore, the terminals of an IC usually have an integrated protection device connected between the terminal and the internal circuits which allows the ESD current to be shunted to an alternative voltage source, e.g., ground, to clamp the induced overvoltage and protect the active internal circuits from damage.

SUMMARY

An overvoltage protection device that includes contacts that tap signal from the active region of semiconductor of the overvoltage protection device for provision to a protected electronic device is disclosed herein. In one embodiment, an electronic circuit includes an electronic device, an input terminal, and a protection device. The electronic device includes a signal terminal to receive an input signal. The input terminal is configured to receive the input signal from a source external to the electronic circuit. The protection device is coupled to the electronic device and to the input terminal. The protection device is configured to protect the electronic device from voltage of the input signal exceeding a predetermined threshold. The protection device includes a first semiconductor region, a first contact, and a second contact. The first contact connects the first semiconductor region to the input terminal. The second contact connects the first semiconductor region to the signal terminal of the electronic device.

In another embodiment, an overvoltage protection device includes a first semiconductor region, a first contact, and a second contact. The first contact is connected to the first semiconductor region and is configured to conduct an input signal to the first semiconductor region. The second contact is connected to the first semiconductor region and is configured to conduct the input signal from the first semiconductor region to an electronic device external to the overvoltage protection device.

In a further embodiment, an electronic circuit includes an electronic device, an input terminal, and a protection device. The electronic device includes a signal terminal to receive an input signal. The input terminal is configured to receive the input signal from a source external to the electronic circuit. The protection device is coupled to the electronic device. The protection device is configured to protect the electronic device from electrostatic discharge, and to reduce voltage at the signal terminal that results from a voltage drop across conductive structures of the protection device to less than the voltage drop across the conductive structures of the protection device.

BRIEF DESCRIPTION OF THE DRAWINGS

For a detailed description of various examples, reference will now be made to the accompanying drawings in which.

DETAILED DESCRIPTION

Figure 1:
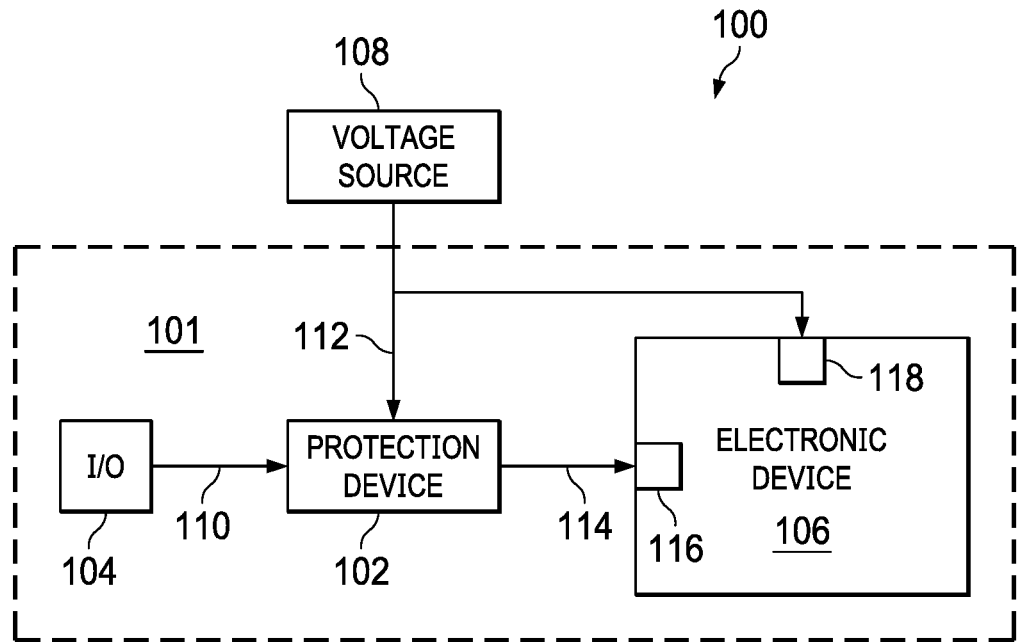
FIG. 1 shows a block diagram of a system that includes circuit overvoltage protection in accordance with various embodiments.

Certain terms are used throughout the following description and claims to refer to particular system components. As one skilled in the art will appreciate, different parties may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections.

In integrated circuits (ICs), electrostatic discharge (ESD) protection structures are often connected between the input/output terminal (I/O terminal) and at least one of the power busses or a dedicated ESD rail. The protection structure switches between a high impedance state during normal operation and a low impedance state during an ESD event. The high impedance state is required to not interfere with the operation of the device. The low impedance (or low resistance) state is required to conduct ESD current which can be in excess of 10 amperes (A) at its peak while maintaining a low ESD induced overvoltage.

For example, diodes used as a protection structure are connected from an I/O terminal to the power busses of an IC.

When using diodes, the change in impedance is obtained by reverse biasing the diodes, where they are essentially non-conducting, during normal operation, and forward biasing the diodes, where they are low impedance, during an ESD event.

In addition to diodes, various other devices and circuits are used to implement ESD protection. For example, anti-parallel diodes or grounded-gate negative metal oxide semiconductor (NMOS) transistors that rely on snap-back to conduct positive ESD current and their inverse diodes to conduct negative ESD current are employed to protect from ESD.

A very effective improvement to ESD protection is the addition of a secondary protection stage, isolated from the primary protection stage by a current-limiting device, such as a series resistor. However, the increased series resistance between the I/O pad and a target circuit will limit the bandwidth of the input signal.

To obtain high input bandwidths in integrated circuits, low parasitic and device capacitances are required. To a first order approximation, the input bandwidth of a devices input stage is inversely proportional to the capacitance at the input. This is because the signal must charge the input capacitance before a change in signal value can be detected. More specifically, to a first order approximation, input stage bandwidth is given by:

$$F_{-3dB} = \frac{1}{2\pi RC}$$

where R is the input resistance, and C is the input capacitance.

The input resistance, R, is often constrained to be between 50 and 100 ohms, so a very effective way to improve the bandwidth is to reduce the input capacitance C. Reducing the input capacitance requires making all structures as small as possible, including the ESD protection structure. However, as the ESD protection structure is reduced in size, the series resistance in the protection structure increases due to the reduction in amount of metal and number of contacts and vias, which in turn increases the ESD-induced voltage drop and reduces the effectiveness of the ESD protection. For example, the contact & via resistance on the signal line side of a miniature ESD structure can easily exceed 0.5 ohms. For a 1000 volt (V) charged device model (CDM) event, the peak current can exceed 10 A, resulting in 5V of additional ESD-induced voltage stress for devices connected to the signal line. The contact resistance and via resistance for the power rail side of miniature ESD structure, can be made much smaller without affecting the input capacitance. Consequently, the contact and via resistance on the power rail side of the ESD structure contribute a much lower ESD induced voltage drop (e.g., 1V) than the contact and via resistance on the signal line side of the ESD structure.

Embodiments of the present disclosure include ESD protection devices that can be reduced in size to decrease capacitance and allow for increased system bandwidth, without compromising ESD protection. In embodiments of the ESD protection devices disclosed herein, contact and via resistance can be increased with miniaturization, and a protected device is not subject to an increase in ESD voltage caused by the increase in voltage drop produced by the increased resistance. Rather, the ESD protection devices disclosed herein include contacts connected to the active region of the semiconductor ESD protection device that tap the signal from the active region for provision to the protected device. Thus, the voltage of the signal (relative to a reference voltage) at a terminal of the protected device is not increased by the voltage drop caused by the series conductor resistance of the ESD protection device, and ESD protection is enhanced relative to conventional protection devices and circuits.

FIG. 1 shows a block diagram of a system 100 that includes circuit overvoltage protection in accordance with various embodiments. The system 100 includes a protection device 102, an input/output (I/O) terminal 104, an electronic device 106, and a voltage source 108. In some embodiments, the voltage source 108 powers the electronic device 106 and other circuits of the system 100. In the system 100, the voltage source 108 is coupled to a reference voltage terminal 118 of the electronic device 106 and the protection device 102.

The I/O terminal 104 is an interface for conducting a signal into the electronic device 106 from a signal source external to the electronic device 106, or conducting a signal from the electronic device 106 to a destination external to the electronic device 106.

The protection device 102 is coupled to the I/O terminal 104, a signal terminal 116 of the electronic device 106, and the voltage source 108. Considering a signal 110 received at the I/O terminal 104 to be input to the electronic device 106, the protection device 102 operates to limit the signal 114, which is a voltage limited version of the signal 110, received by the electronic device 106 at the signal terminal 116 to a voltage that can be safely applied to the electronic device 106. For example, in some embodiments, the protection device 102 limits the signal 114 to approximately the voltage of the signal 112 provided by the voltage source 108.

In a conventional arrangement, a protection device and the electronic device 106 are connected in parallel between the I/O terminal 104 and the voltage source 108. As a result, the voltage drop across a parasitic resistance of the protection device can produce an increase in the voltage across the electronic device 106 to a value that exceeds the operational specifications of the electronic device 106. The parasitic resistance of the conventional protection device increases as the size of the protection device is decreased to reduce its capacitance and increase the bandwidth.

To alleviate this deficiency of conventional protection device arrangements, in the system 100 the protection device 102 includes separate contacts for providing the signal 114 to the electronic device 106. The separate contacts tap the signal 114 from an active region of the semiconductor of the protection device 102. Accordingly, the voltage of the signal 114, relative to the signal 112 does not include the voltage dropped across the parasitic resistance of the protection device 102, which can substantially reduce the voltage across the electronic device 106 when an overvoltage, such as an ESD event, is presented on the I/O terminal 104.

In some embodiments, multiple components of the system 100 are combined in a single integrated circuit 101. For example, the I/O terminal 104, the protection device 102, and the electronic device 106 are disposed in a single integrated circuit 101 in some embodiments. In some embodiments, the electronic device 106 is an analog-to-digital converter that provides increased input signal bandwidth by reducing the capacitance of the protection device 102 while providing improved overvoltage protection as disclosed herein.

Figure 2:
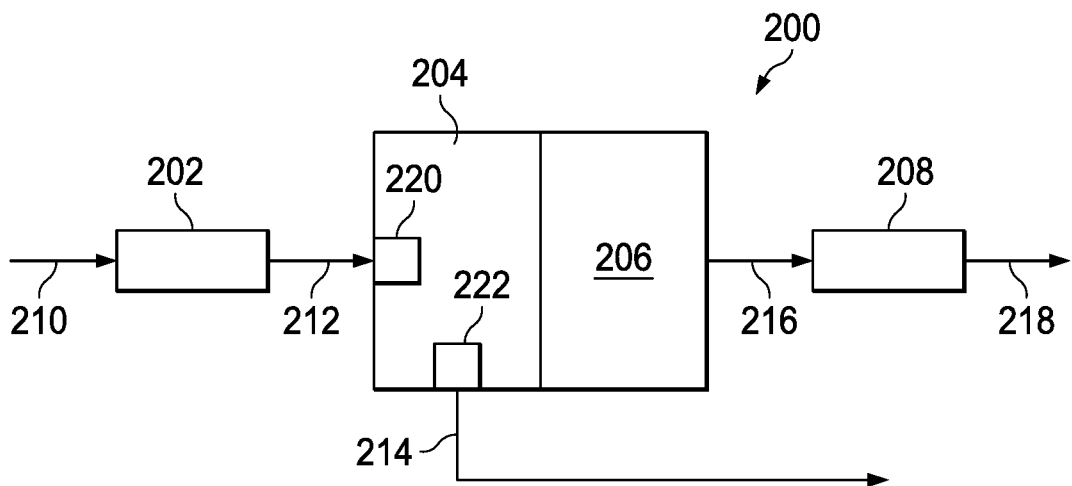
FIG. 2 shows a block diagram of a circuit overvoltage protection device in accordance with various embodiments.

FIG. 2 shows a block diagram of a circuit overvoltage protection device 200 in accordance with various embodiments. The circuit overvoltage protection device 200 is an embodiment of the protection device 102. The circuit overvoltage protection device 200 includes a first resistance 202, a first semiconductor region 204, a second semiconductor region 206, and a second resistance 208. The input signal 210, received by the circuit overvoltage protection device 200 passes through the first resistance 202, and the voltage of the input signal 210 is dropped across the first resistance 202 to produce signal 212. Signal 212 is applied to the first semiconductor region 204 via contacts 220. The first semiconductor region 204 is a p-type semiconductor material in some embodiments. The first semiconductor region 204 is adjacent to the second semiconductor region 206. The second semiconductor region 206 is an n-type semiconductor material in some embodiments. The signal 216 of the circuit overvoltage protection device 200 passes through the second resistance 208, and the voltage of the signal 216 is dropped across the second resistance 208 to produce the signal 218.

In the circuit overvoltage protection device 200, signal 214 is tapped off the first semiconductor region 204 via contacts 222 for provision to an electronic device being protected, e.g., the electronic device 106. For example, the signal 214 is provided to the electronic device 106 as the signal 114 shown in FIG. 1. The voltage difference between the signal 214 and the signal 218 is substantially smaller than the voltage difference between the input signal 210 and the signal 218 because the voltage drop across the first resistance 202 is not included in the signal 214.

While the circuit overvoltage protection device 200 is illustrated as a diode that includes two semiconductor regions, some embodiments include more than two semiconductor regions. For example, in some embodiments, the circuit overvoltage protection device 200 is a transistor, such as a metal oxide semiconductor field effect transistor (MOSFET) that includes three semiconductor regions.

Figure 3:
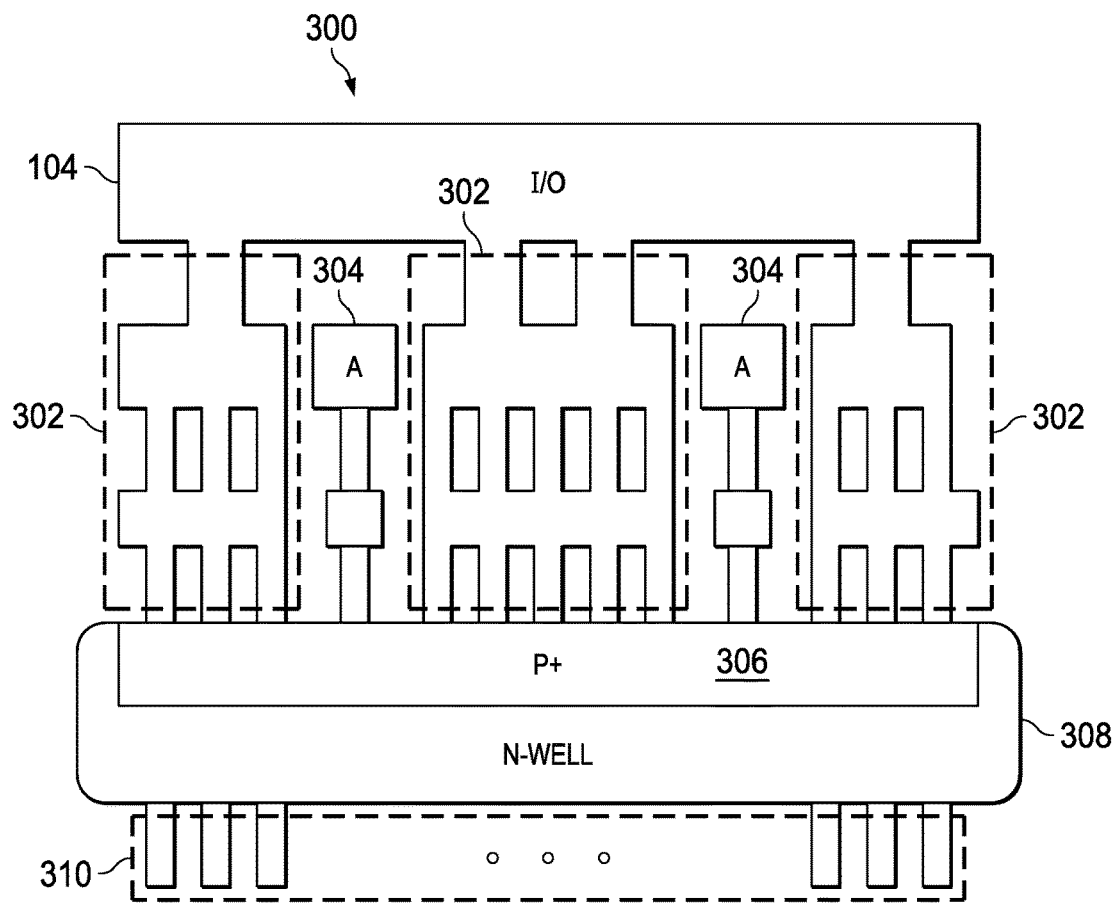
FIG. 3 shows a diagram of a circuit overvoltage protection device in accordance with various embodiments.

FIG. 3 shows a diagram of a circuit overvoltage protection device 300 in accordance with various embodiments. The circuit overvoltage protection device 300 is an embodiment of the circuit overvoltage protection device 200 and the protection device 102. The circuit overvoltage protection device 300 includes conductors in the form of metal vias, islands and contacts 302 that connect the I/O terminal 104 to a first semiconductor region 306. The resistance of the metal vias, islands and contacts 302 forms the first resistance 202 shown in FIG. 2. As the number of vias and contacts 302 decreases, the resistance increases, which in turn increases the voltage drop across the vias, metal islands and contacts 302.

The circuit overvoltage protection device 300 also includes conductors in the form of metal vias, islands and contacts 304 that connect the first semiconductor region 306 to an electronic device being protected, e.g., the electronic device 106. By connecting an electronic device being protected to the first semiconductor region 306 through the vias and contacts 304, the signal provided to the electronic device being protected is not subject the voltage drop across the vias and contacts 302 (i.e., the signal voltage is reduced).

The circuit overvoltage protection device 300 further includes conductors in the form of metal vias, islands and contacts 310 that connect the second semiconductor region 308 to other devices. The resistance of the metal vias, islands and contacts 310 forms the second resistance 208 shown in FIG. 2. The resistance of the vias and contacts 310 can be substantially smaller than the resistance of the vias and contacts 302 because the capacitance of the vias and contacts 310 does not affect the bandwidth.

Figure 4:
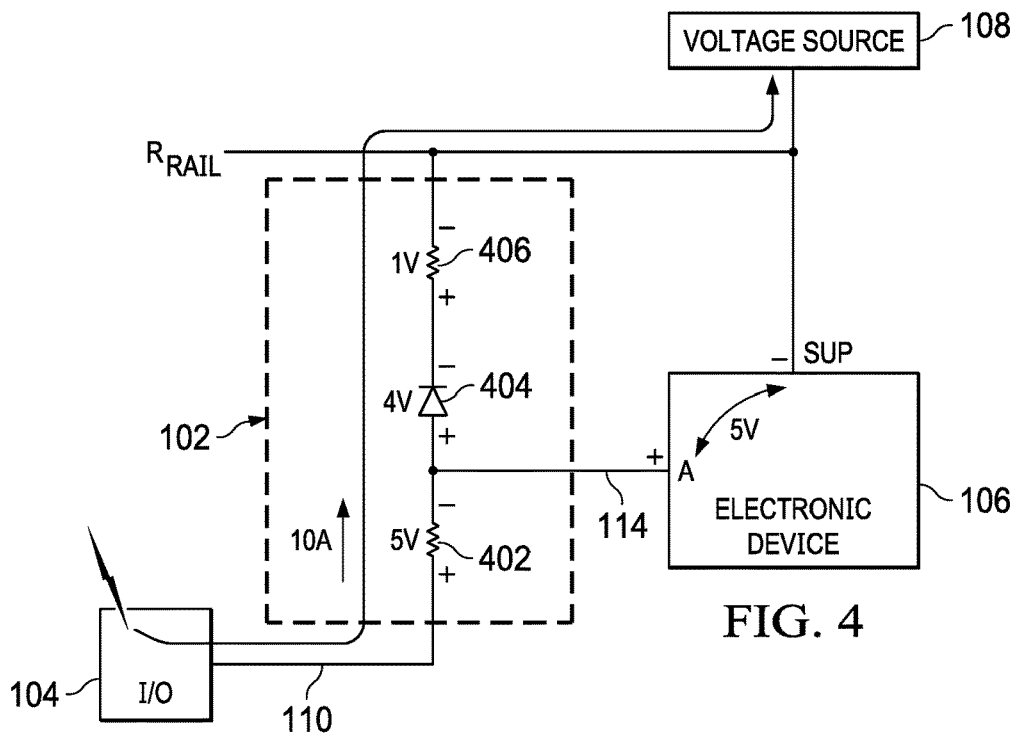
FIG. 4 shows an example of operation of a circuit overvoltage protection device in accordance with various embodiments.

FIG. 4 shows an example of operation of the protection device 102 in accordance with various embodiments. In FIG. 4, the protection device 102 is connected to the I/O terminal 104, the electronic device 106, and the voltage source 108 as shown in FIG. 1. An ESD event at the I/O terminal 104 produces a 10A current flowing through the protection device 102 to the voltage source 108. The parasitic resistance 402 of the protection device 102 has resistance of 0.5Ω, which produces a 5V drop across the parasitic resistance 402. The voltage drop across the diode 404 is 4V. The parasitic resistance 406 of the protection device 102 has a resistance of 0.1Ω, which produces a 1V drop across the parasitic resistance 406. By tapping the signal 114 off the semiconductor of the diode 404, the protection device 102 reduces the voltage induced across the electronic device 106 by the ESD event by 5V. That is, the voltage at the input of the electronic device 106 is 5V relative to the signal 112 rather than 10V. Thus, embodiments of the protection device 102 reduce the voltage presented to the electronic device 106 during an overvoltage transient, such as an ESD event, while allowing the capacitance of the protection device 102 to be decreased.

Figure 5:
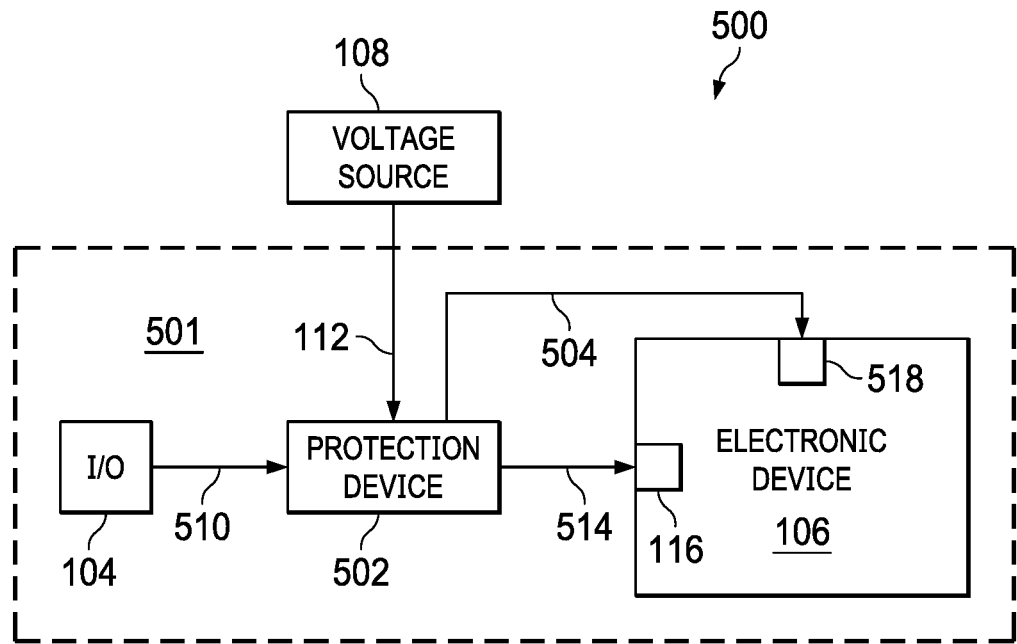
FIG. 5 shows a block diagram of a system that includes circuit overvoltage protection in accordance with various embodiments.

FIG. 5 shows a block diagram of a system 500 that includes circuit overvoltage protection in accordance with various embodiments. The system 500 is similar to the system 100 shown in FIG. 1. The system 500 includes a protection device 502, an input/output (I/O) terminal 104, an electronic device 106, and a voltage source 108. In some embodiments, the voltage source 108 is a power supply circuit that powers the electronic device 106 and other circuits of the system 500. In the system 500, the voltage source 108 is coupled to the protection device 502.

The I/O terminal 104 is an interface for conducting a signal to the electronic device 106 from a signal source external to the electronic device 106, or conducting a signal from the electronic device 106 to a destination external to the electronic device 106.

The protection device 502 is coupled to the I/O terminal 104, a signal terminal 116 of the electronic device 106, and the voltage source 108. Considering a signal 510 received at the I/O terminal 104 to be input to the electronic device 106, the protection device 102 operates to limit the signal 514 received by the electronic device 106 at the signal terminal 116 to a voltage that can be safely applied to the electronic device 106. For example, in some embodiments, the protection device 502 limits the signal 514 to approximately the voltage of the signal 112 provided by the voltage source 108.

Like the protection device 102, the protection device 502 includes additional contacts that tap the signal 514 from a first region of the semiconductor of the protection device 502, thereby eliminating voltage increase at the electronic device 106 caused by voltage drop across the resistance in the I/O 104 side of the protection device 502. The protection device 502 also include contacts that tap the reference signal 504 from a second region of the semiconductor of the protection device 502, thereby eliminating voltage increase at the electronic device 106 caused by voltage drop across the resistance in the voltage source 108 side of the protection device 502. For example, in some embodiments, the reference signal 504 is connected to a reference voltage terminal 518 of the electronic device 106. Accordingly, the voltage of the signal 514, relative to the reference signal 504 does not include the voltage drops across the parasitic resistances of the protection device 502, which can substantially reduce the voltage across the electronic device 106 when an overvoltage, such as an ESD event, is presented on the I/O terminal 104.

In some embodiments, multiple components of the system 500 are combined in a single integrated circuit 501. For example, the I/O terminal 104, the protection device 502 and the electronic device 106 are disposed in the single integrated circuit 501 in some embodiments. In some embodiments, the electronic device 106 is an analog-to-digital converter that provides increased input signal bandwidth by reducing the capacitance of the protection device 502 while providing improved overvoltage protection.

Figure 6:
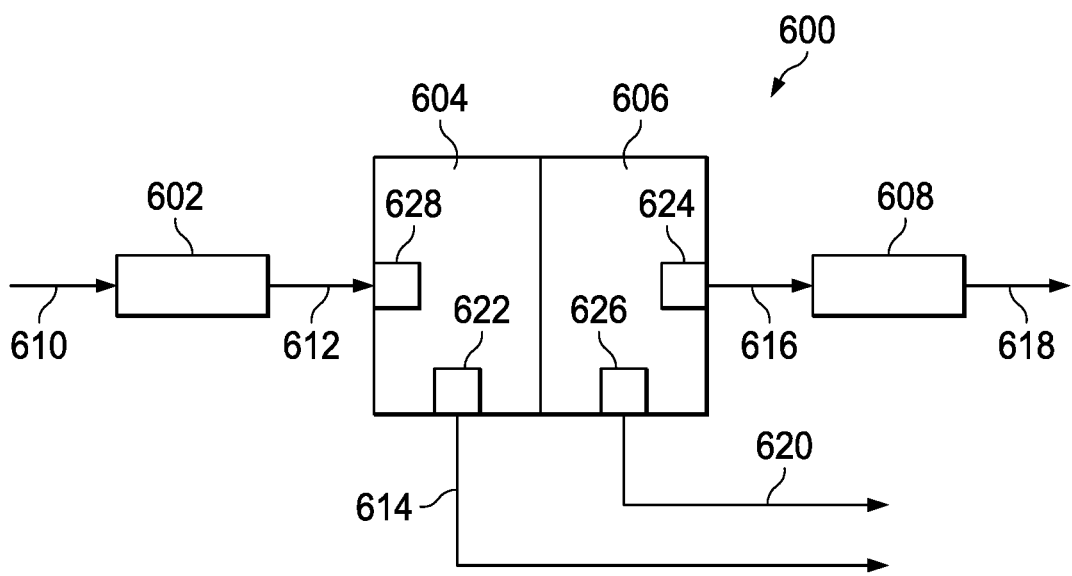
FIG. 6 shows a block diagram of a circuit overvoltage protection device in accordance with various embodiments.

FIG. 6 shows a block diagram of a circuit overvoltage protection device 600 in accordance with various embodiments. The circuit overvoltage protection device 600 is an embodiment of the protection device 502. The circuit overvoltage protection device 600 includes a first resistance 602, a first semiconductor region 604, a second semiconductor region 606, and a second resistance 608. The input signal 610, received by the circuit overvoltage protection device 600 passes through the first resistance 602, and voltage of the input signal 610 is dropped across the first resistance 602 to produce signal 612. Signal 612 is applied to the first semiconductor region 604 via contacts 628. The first semiconductor region 604 is a p-type semiconductor material in some embodiments. The first semiconductor region 604 is adjacent to the second semiconductor region 606. The second semiconductor region 606 is an n-type semiconductor material in some embodiments. The signal 616 exits the second semiconductor region 606 via contacts 624, passes through the second resistance 608, and the voltage of the signal 616 is dropped across the second resistance 608 to produce the signal 618.

In the circuit overvoltage protection device 600, signal 614 is tapped off of the first semiconductor region 604 using dedicated contacts 622 for provision to an electronic device being protected, e.g., the electronic device 106. For example, in some embodiments, the signal 614 is provided to the electronic device 106 as the signal 514 shown in FIG. 5. The voltage difference between the signal 614 and the signal 618, where signal 618 is at a reference voltage (e.g., ground) output by the voltage source 108, is substantially smaller than the voltage difference between the input signal 610 and the signal 618 because the voltage drop across the first resistance 602 is not included in the signal 614.

Similarly, the signal 620 is tapped off the second semiconductor region 606 using dedicated contacts 626 for provision to an electronic device being protected, e.g., the electronic device 106. For example, in some embodiments, the signal 620 is provided to the electronic device 106 (reference voltage terminal 518) as the reference signal 504 shown in FIG. 5. The voltage difference between the signal 614 and the signal 620 is substantially smaller than the voltage difference between the signal 614 and the signal 618 because the voltage drop across the second resistance 608 is not included in the signal 620.

While the circuit overvoltage protection device 600 is illustrated as a diode that includes two semiconductor regions, some embodiments include more than two semiconductor regions. For example, in some embodiments, the circuit overvoltage protection device 600 is a transistor, such as a MOSFET that includes three semiconductor regions.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An overvoltage protection device, comprising:
    a first semiconductor region;
    a first contact connected to the first semiconductor region and configured to conduct an input signal to the first semiconductor region; and
    a second contact connected to the first semiconductor region and configured to conduct the input signal from the first semiconductor region to an electronic device external to the overvoltage protection device.

2. The overvoltage protection device of claim 1, wherein a resistance produces a voltage drop, and conduction of the input signal from the first semiconductor region to the electronic device via the second contact reduces a voltage of the input signal at the electronic device by the voltage drop.

3. The overvoltage protection device of claim 1, further comprising:
    a second semiconductor region adjacent to the first semiconductor region; and
    a third contact connected to the second semiconductor region; wherein the third contact is configured to conduct signal from the second semiconductor region to a voltage source.

4. The overvoltage protection device of claim 3, wherein the first semiconductor region and the second semiconductor region form a diode.

5. The overvoltage protection device of claim 3, further comprising a fourth contact connected to the second semiconductor region; wherein the fourth contact is configured to conduct a reference signal from the second semiconductor region to the electronic device external to the overvoltage protection device.

6. The overvoltage protection device of claim 3, wherein a resistance associated with the third contact produces a voltage drop, and conduction of the reference signal from the second semiconductor region to the electronic device via the fourth contact reduces a voltage of the input signal at the electronic device by the voltage drop.

7. The overvoltage protection device of claim 1, wherein the overvoltage protection device is configured to provide protection from electrostatic discharge.

* * * * *